United States Patent
Yu et al.

(10) Patent No.: US 8,907,338 B2
(45) Date of Patent: Dec. 9, 2014

(54) SEMICONDUCTOR DEVICE

(71) Applicant: Hannstar Display Corp., New Taipei (TW)

(72) Inventors: Chia-Hua Yu, New Taipei (TW); Ming-Chieh Chang, Hsinchu County (TW); Jung-Fang Chang, Tainan (TW)

(73) Assignee: Hannstar Display Corp., New Taipei (TW)

( * ) Notice: Subject to any disclaimer, the term of this patent is extended or adjusted under 35 U.S.C. 154(b) by 0 days.

(21) Appl. No.: 13/908,061

(22) Filed: Jun. 3, 2013

(65) Prior Publication Data
US 2014/0048797 A1  Feb. 20, 2014

(30) Foreign Application Priority Data
Aug. 17, 2012  (CN) .......................... 2012 1 0296012

(51) Int. Cl.
*H01L 29/12* (2006.01)
*H01L 29/417* (2006.01)
*H01L 29/786* (2006.01)

(52) U.S. Cl.
CPC .... *H01L 29/78696* (2013.01); *H01L 29/41733* (2013.01); *H01L 29/7869* (2013.01)
USPC ................... 257/43; 257/57; 257/59; 257/66; 257/72; 257/347

(58) Field of Classification Search
CPC ..................... H01L 29/7869; H01L 29/66765; H01L 29/4909; H01L 27/12; H01L 29/78678; H01L 29/78669; H01L 51/105; H01L 29/458
USPC ............................ 257/43, 57, 59, 66, 72, 347
See application file for complete search history.

(56) References Cited

U.S. PATENT DOCUMENTS 8,426,868 B2 *  4/2013 Akimoto et al. ................ 257/72
2013/0299827 A1 * 11/2013 Yamazaki et al. .............. 257/43

* cited by examiner

*Primary Examiner* — Thien F Tran
(74) *Attorney, Agent, or Firm* — Rosenberg, Klein & Lee

(57) ABSTRACT

There is provided a semiconductor device including a first conductive layer, an insulating layer, a second conductive layer, a channel layer, a passivation layer and a third conductive layer. The insulating layer covers the first conductive layer. The second conductive layer is formed on the insulating layer and has an inner opening. The channel layer is formed on the inner opening of the second conductive layer to fully cover the inner opening. The passivation layer is formed upon the channel layer to cover the channel layer and has a contact hole inside the inner opening of the second conductive layer. The third conductive layer is formed in the contact hole.

20 Claims, 5 Drawing Sheets

SEMICONDUCTOR DEVICE

CROSS REFERENCE TO RELATED APPLICATION

This application claims the priority benefit of Chinese Patent Application Number 201210296012.4, filed on Aug. 17, 2012, the full disclosure of which is incorporated herein by reference.

BACKGROUND

1. Field of the Disclosure

This disclosure generally relates to a semiconductor device and, more particularly, to a thin film transistor device.

2. Description of the Related Art

Referring to FIG. 1, it shows a cross-sectional view of the conventional thin film transistor 9, which includes a substrate 91, a gate electrode 92, an insulating layer 93, a channel layer 94, a source electrode 95 and a drain electrode 96.

The operation of the thin film transistor 9 is to electrically turn on or turn off the channel layer 94 by controlling the voltage on the gate electrode 92. When the channel layer 94 is turned on, display data is sent from the source electrode 95 to the drain electrode 96 so that image data can be shown. When the channel layer 94 is turned off, the display data can not be sent to the drain electrode 96 from the source electrode 95 so that the image data can not be shown.

In the conventional thin film transistor 9, the channel layer 94 is made of amorphous silicon. However, it is known that the amorphous thin film transistor has a lower mobility and reliability. Accordingly, in recent years, so called metal oxide semiconductor thin film transistor is provided in which the channel layer is made of metal oxide semiconductor.

However, simply replacing the channel layer 94 in FIG. 1 by the metal oxide can have following problems. As the source electrode 95, the drain electrode 96 and the channel layer 94 have a lower etching selectivity, and the source electrode 95 and the drain electrode 96 are formed after the channel layer 94, the channel layer 94 can be over-etched to degrade the operating performance thereof when etching the source electrode 95 and the drain electrode 96. In addition, in the structure shown in FIG. 1, the source electrode 95 and the drain electrode 96 are formed by the same manufacturing process so that they are at the same plane, and thus it is difficult to increase the channel width/length ratio (W/L) of the active layer.

Accordingly, the present disclosure further provides a thin film transistor structure that may effectively prevent the metal oxide semiconductor channel layer from being affected by the etching liquid during manufacturing and may increase the channel width/length ratio.

SUMMARY

It is an object of the present disclosure to provide a semiconductor device that has a higher channel width/length ratio.

It is another object of the present disclosure to provide a semiconductor device that has an enclosed source/drain electrode or a pi-shaped (|=) source/drain electrode.

It is another object of the present disclosure to provide a semiconductor device in which the source electrode and the drain electrode are not manufactured by the same manufacturing process so that the source electrode and the drain electrode are not at the same plane.

It is another object of the present disclosure to provide a metal oxide thin film transistor in which the metal oxide semiconductor channel layer is not over-etched during manufacturing processes.

The present disclosure provides a semiconductor device including a first conductive layer, an insulating layer, a second conductive layer, a channel layer, a passivation layer and a third conductive layer. The insulating layer covers the first conductive layer. The second conductive layer is formed on the insulating layer and has an inner opening. The channel layer is formed on the inner opening of the second conductive layer to fully cover the inner opening. The passivation layer is formed upon the channel layer to cover the channel layer and has a contact hole inside the inner opening of the second conductive layer. The third conductive layer is formed in and extending out from the contact hole.

The present disclosure further provides a semiconductor device including a first conductive layer, an insulating layer, a second conductive layer, a channel layer, a passivation layer, a third conductive layer and a transparent electrode layer. The insulating layer covers the first conductive layer. The second conductive layer is formed on the insulating layer and has an inner opening. The channel layer is formed on the inner opening of the second conductive layer to fully cover the inner opening. The passivation layer is formed upon the channel layer to cover the channel layer and has a contact hole inside the inner opening of the second conductive layer. The third conductive layer is formed in the contact hole. The transparent electrode layer is electrically coupled to and extending out from the third conductive layer.

The present disclosure further provides a semiconductor device including a first conductive layer, an insulating layer, a second conductive layer, a channel layer, a passivation layer and a third conductive layer. The insulating layer covers the first conductive layer. The second conductive layer is formed on the insulating layer and has a first part, a second part and a third part, wherein the second part and the third part extend perpendicularly from the first part. The channel layer is formed inside the first part, the second part and the third part and respectively covers a part of the first part, the second part and the third part. The passivation layer is formed upon the channel layer to cover the channel layer and has a contact hole between the second part and the third part. The third conductive layer is formed in the contact hole.

In one aspect, distances from edges of the contact hole to the second conductive layer are all identical so that the edges of the contact hole may define the channel width of the active layer of the semiconductor device, wherein the distances may be the vertical distance or the shortest distance.

In one aspect, the contact hole and an inner edge of the second conductive layer are opposite to each other and formed as a rectangle or a square.

In one aspect, an overcoat layer is further formed between the passivation layer and the transparent electrode layer so as to reduce the stray capacitance between the electrodes.

In one aspect, a contact layer is further formed between the second conductive layer and at least one of the insulating layer and the channel layer.

In the semiconductor device of the present disclosure, the channel layer may be a metal oxide, an amorphous silicon, a polysilicon or a single crystal silicon semiconductor channel layer. By manufacturing the source electrode and the drain electrode in different manufacturing processes, it is able to increase the manufacturing range of the source electrode thereby increasing the channel width of the active layer.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Referring to FIGS. 2A-2E, they show manufacturing processes of the semiconductor device according to a first embodiment of the present disclosure. In FIGS. 2A-2C and 2D-2E, the right part is a top view of the semiconductor device and the left part is a cross-sectional view take along line II-II' in the top view. It should be mentioned that, for simplification, the top views in FIGS. 2A-2E only show the conductive layers M1-M3 and the channel layer 12 without showing the substrate 10, the insulating layer 11, the passivation layer 13 and contact layers $L_{C1}$, $L_{C2}$, wherein the top views are mainly to show the arrangement of the conductive layers M1-M3. In the present disclosure, the semiconductor device may be a thin film transistor (TFT) device.

Firstly, a substrate 10 is provided. The substrate 10 may be a glass substrate or other substrates adapted to form a thin film transistor array thereon.

Figure 2A:
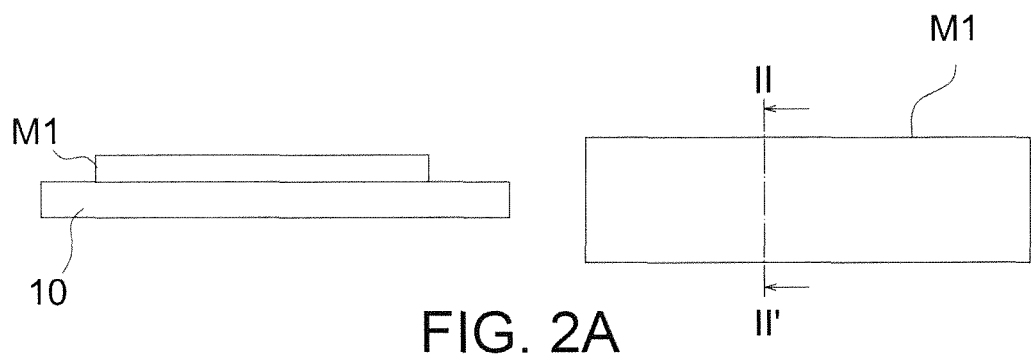
FIGS. 2A-2E show manufacturing processes of the semiconductor device according to a first embodiment of the present disclosure.

As shown in FIG. 2A, a first conductive layer M1 is then formed on the substrate 10 to be served as a gate electrode. The method of forming the gate electrode is to deposit a conductive layer on the substrate 10 at first and then to pattern the conductive layer by means of photolithography. The first conductive layer M1 may be made of suitable conductive materials without any limitation, such as Mo, Al, Ti, Cr, Ta, Cu, Nd, W, W—Mo alloy, Indium Tin Oxide (ITO), or the Oxide or Nitrogen thereof. In FIG. 2A, although the conductive layer M1 is shown as a single layer structure, it may also have a multi-layer structure.

Figure 2B:
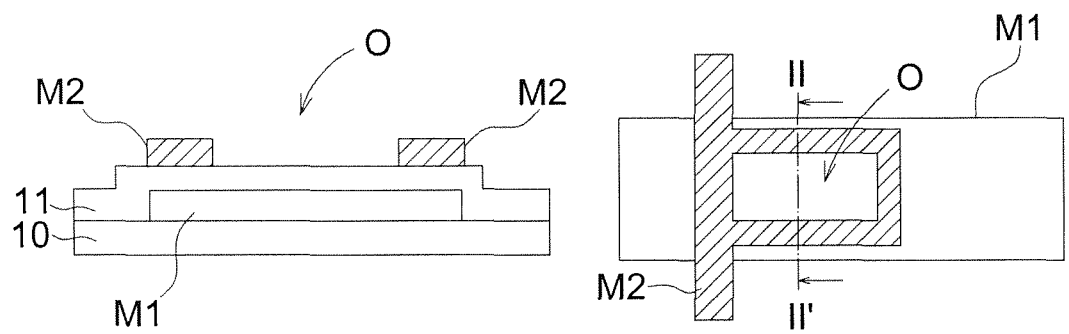

As shown in FIG. 2B, an insulating layer 11 is then formed to cover the first conductive layer M1 and a part of the substrate 10, wherein the insulating layer 11 is generally called the gate insulating layer and may be made of inorganic materials (e.g. silicon oxide, silicon nitride, Aluminium oxide, silicon oxynitride), organic materials or their combination. The insulating layer 11 may have a thickness between 50 nm to 400 nm.

As shown in FIG. 2B, a second conductive layer M2 is then formed on the insulating layer 11 and the second conductive layer M2 has an inner opening O therein. In this embodiment, the second conductive layer M2 is served as a source/drain electrode. The method of forming the source/drain electrode is to deposit a conductive layer on the insulating layer 11 at first and then pattern the conductive layer by means of photolithography so as to form a ring-shaped second conductive layer M2. The second conductive M2 may be made of suitable conductive materials without any limitation, such as Mo, Al, Ti, Cr, Ta, Cu, Nd, W, W—Mo alloy, Indium Tin Oxide (ITO), or the Oxide or Nitrogen thereof. In FIG. 2B, although the conductive layer M2 is shown as a single layer structure, it may also have a multi-layer structure.

Figure 2C:
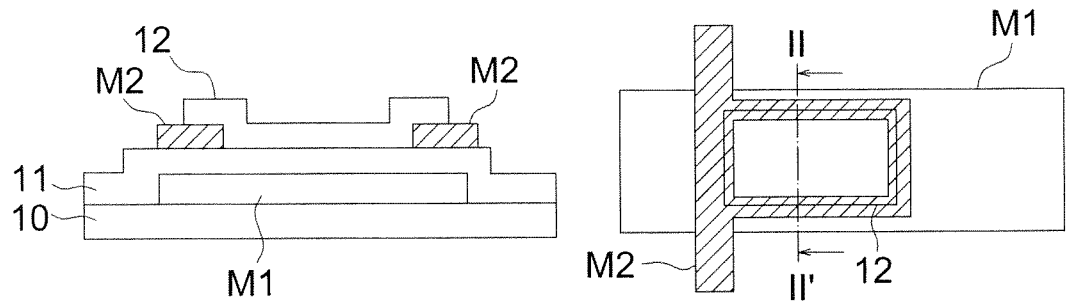
Figures 1, 2C:
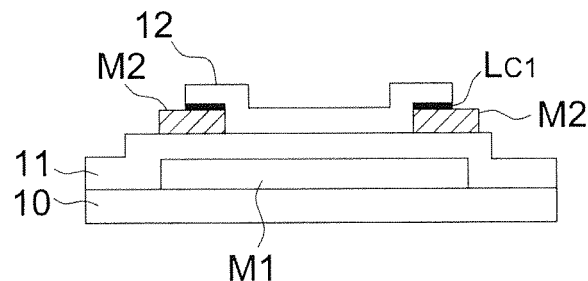

As shown in FIG. 2C, a channel layer 12 is then formed on the inner opening O of the second conductive layer M2 and the channel layer 12 fully covers the inner opening O. In one embodiment, the channel layer 12 may also cover a part of the second conductive layer M2, wherein the channel layer 12 may be a metal oxide, an amorphous silicon, a polysilicon or a single crystal silicon semiconductor channel layer. The channel layer 12 may also be patterned by means of photolithography. A thickness of the channel layer 12 may be between 51 nm to 200 nm. If the channel layer 12 is a metal oxide channel layer, it may be made of indium oxide, gallium oxide and zinc oxide. In addition, it is possible to use W, Mo, Ti, Sn, Ni or Al to replace any one of In, Ga and Zn, e.g. IGZO, ZnO, SnO, $SnO_2$ and so on, but not limited thereto.

Figure 1:
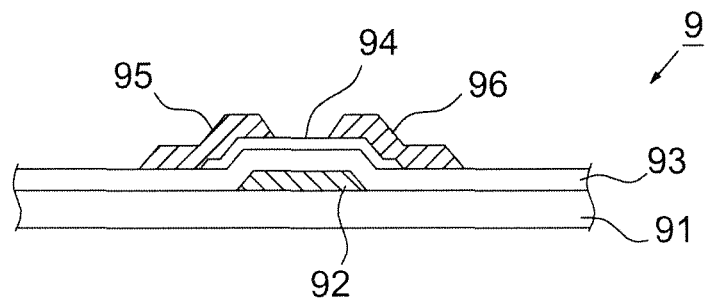
FIG. 1 shows a cross-sectional view of the conventional thin film transistor.

In forming the thin film transistor, the source electrode and the drain electrode are preferably made of metal material having a low resistance. Especially, in manufacturing the display device for large size display, the signal delay caused by the line resistance is obvious. Therefore, the signal lines and electrodes are preferably made of metal material having a low resistance. In a thin film transistor, if the source electrode and the drain electrode, which are made of the metal material having a low resistance, are directly in contact with the metal oxide channel layer having a high resistance, the contact resistance therebetween may be increased. Furthermore, the interface between the source/drain electrode and the metal oxide channel layer may have film cracking due to different materials. Therefore, in another embodiment a contact layer $L_{C1}$ may further be formed, as shown in FIG. 2C-1, so as to reduce the contact resistance between the source/drain electrode (i.e. the second conductive layer M2) and the channel layer 12 and prevent film cracking, wherein a thickness of the contact layer $L_{C1}$ may be between 5 nm to 50 nm. The resistance of the contact layer $L_{C1}$ is preferably lower than that of the channel layer 12, or the oxygen content of the contact layer $L_{C1}$ is preferably lower than that of the channel layer 12.

Figures 2, 2C:
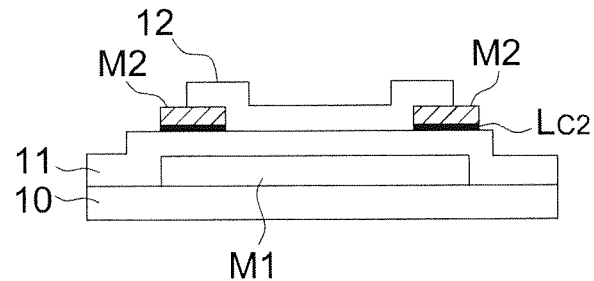
Figures 2, 2C, 3:
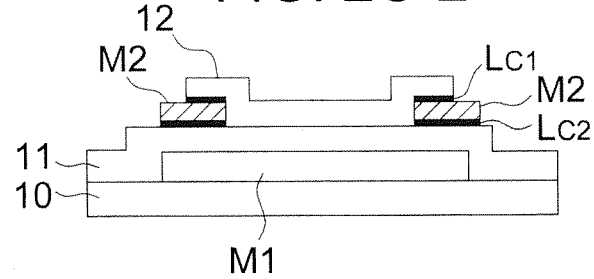

In addition, a contact layer $L_{C2}$ having a low resistance may further be formed between the insulating layer 11 and the electrode/drain electrode M2 as shown in FIG. 2C-2 so as to prevent film cracking. In another embodiment, two contact layers $L_{C1}$ and $L_{C2}$ may respectively formed on the upper surface and the lower surface of the source/drain electrode M2 in contact with the channel layer 12 and the insulating layer 11 respectively, as shown in FIG. 2C-3. The contact layer may be a metal oxide layer, e.g. indium oxide, gallium oxide and zinc oxide, or it is possible to use W, Mo, Ti, Sn, Ni or Al to replace any one of In, Ga and Zn, e.g. IGZO, ZnO, SnO, $SnO_2$ and so on, but not limited thereto. The channel layer 12 and the contact layer $L_{C1}$ may be distinguished according to the resistance and the oxygen content thereof, wherein the resistance of the contact layer $L_{C1}$ may be lower than that of the channel layer 12, or the oxygen content of the contact layer $L_{C2}$ may be lower than that of the channel layer 12, or the thickness of the contact layer $L_{C1}$ may be smaller than that of the channel layer 12. The contact layer $L_{C1}$ may or may not identical to the contact layer $L_{C2}$.

Figure 2D:
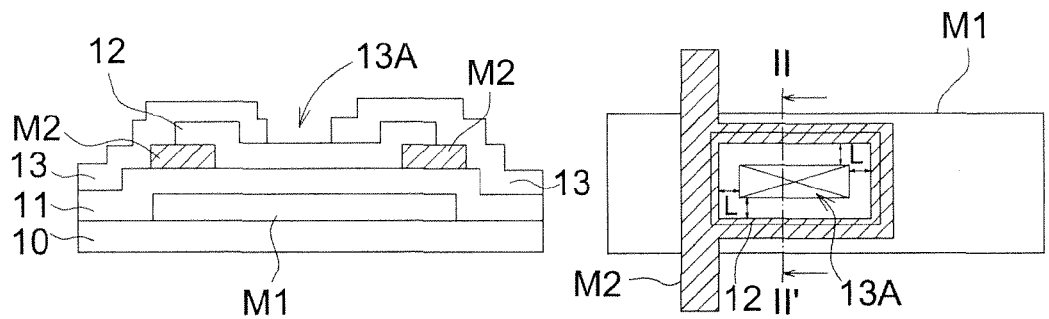

Referring to FIG. 2D, a passivation layer 13 is then formed upon the channel layer 12 to cover the channel layer 12. In another embodiment, the passivation layer 13 may also cover a part of the second conductive layer M2 that is not covered by the channel layer 12. The passivation layer 13 may also cover the insulating layer 11. A contact hole 13A may be defined in the passivation layer 13 and located inside the inner opening O of the second conductive layer M2. Preferably, the contact hole 13A locates at a center position of the inner opening O of the second conductive layer M2. In order to increase the channel width/length ratio of the semiconductor device, distances L from edges of the contact hole 13A to the second conductive layer M2 are all identical (as shown in the right part of FIG. 2D) so as to form the active channel between the inner edge of the second conductive layer M2 and the edges of the contact hole 13A, wherein the distances L may be the vertical distance or the shortest distance. As long as the distances L are identical everywhere, the shapes of the contact hole 13A and the inner edge of the second conductive layer M2 do not have any limitation; e.g. may be formed as opposite rectangles, squares or symmetric polygons, but not limited thereto. The contact hole 13A may also be formed by means of photolithography. The passivation layer 13 may be made of silicon oxide, silicon nitride. Aluminium oxide and so on, but not limited thereto, as long as the material is able to protect the thin film transistor.

Figure 2E:
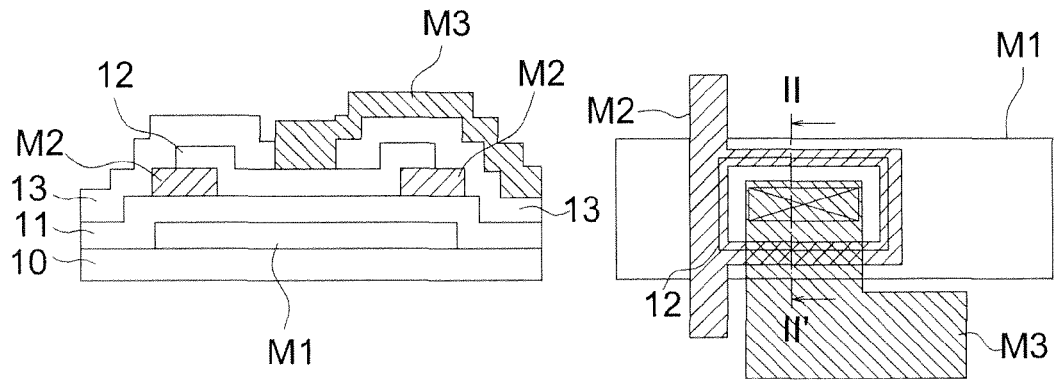

Referring to FIG. 2E, finally a third conductive layer M3 is formed in the contact hole 13A and extends out from the contact hole 13A. The third conductive layer M3 is configured to couple to the pixel electrode. In this embodiment, the third conductive layer M3 is served as the drain/source electrode and formed simultaneously with the pixel electrode by means of photolithography. Therefore, the third conductive layer M3 may have the same material as the pixel electrode thereby forming a transparent electrode layer, such as ITO, IZO and AZO, but not limited thereto.

In this embodiment, the saturation current of the semiconductor device is effectively improved due to the ring arrangement of the second conductive layer M2. Since the second conductive layer M2 and the third conductive layer M3 are not formed by the same manufacturing process and not at the same plane, the manufacturing range of the source electrode is increased. In addition, as the channel layer 12 is formed after the second conductive layer M2, the channel layer 12 is not affected by the etching liquid during manufacturing processes if it is a metal oxide semiconductor channel layer.

Figures 3A, 3B:
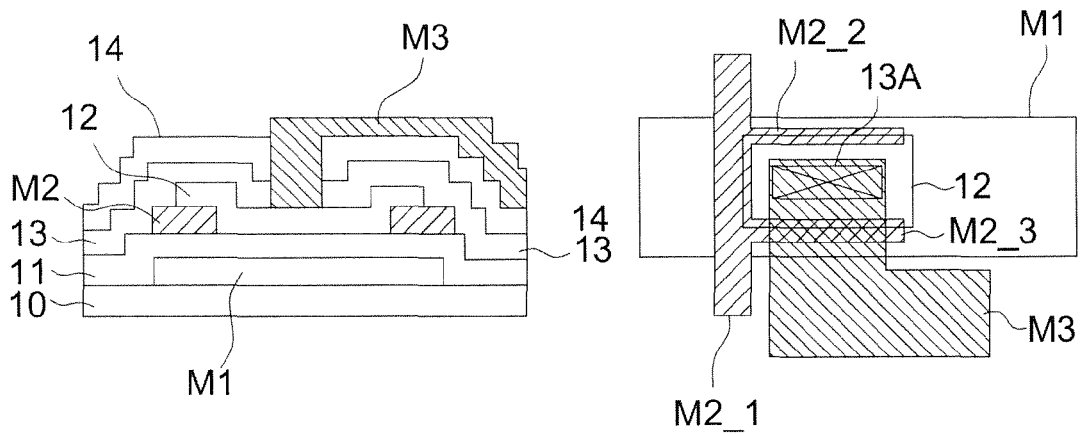
FIGS. 3A-3B show an alternative embodiment of the semiconductor device according to the first embodiment of the present disclosure.

In an alternative embodiment, in order to reduce the stray capacitance between the second conductive layer M2 and the third conductive layer M3, an overcoat layer 14 may further be formed between the passivation layer 13 and the third conductive layer M3 as shown in FIG. 3A, wherein the overcoat layer 14 may have a thickness between 1000 nm to 3000 nm, and may be made of organic materials or inorganic materials so as to increase the distance between the second conductive layer M2 and the third conductive layer M3. It is appreciated that a contact hole may also be defined, by means of photolithography, in the overcoat layer 14 corresponding to the contact hole 13A so that the third conductive layer M3 may be formed in the contact hole 13A. In another embodiment, if the overcoat layer 14 is not implemented, it is able to increase the thickness of the passivation layer 13 to between 2000 nm-4000 nm so as to reduce the stray capacitance.

In an alternative embodiment, the second conductive layer M2 may be formed as a pi-shaped structure (|=) as shown in FIG. 3B instead of an enclosed structure. In this embodiment, the second conductive layer M2 is also formed on the insulating layer 11 and has a first part M2_1, a second part M2_2 and a third part M2_3, wherein the first part M2_1 may be served as a part of the data line, and the second part M2-2 and the third part M2_3 perpendicularly extend from the first part M2_1 in parallel so as to form a non-enclosed structure. Similarly, in this embodiment the method of forming the second conductive layer M2 is to deposit a conductive layer on the insulating layer 11 at first and then pattern the conductive layer by means of photolithography so as to form the non-enclosed first part M2_1, second part M2_2 and third part M2_3.

In this embodiment, as the second conductive layer M2 is a non-enclosed structure, the channel layer 12 is formed inside the first part M2_1, second part M2_2 and third part M2_3 and covers a part of the first part M2_1, second part M2_2 and third part M2_3 respectively. The passivation layer 13 is formed upon the channel layer 12 to cover the channel layer 12. In other embodiments, the passivation layer 13 may also cover a part of the second conductive layer M2 that is not covered by the channel layer 12 and has a contact hole 13A located between the second part M2_2 and the third part M2_3. The third conductive layer M3 is formed inside the contact hole 13A and extends out from the contact hole 13A. In this embodiment, the third conductive layer M3 is a transparent electrode layer. Similarly, in order to increase the channel width/length ratio of the semiconductor device, distances from edges of the contact hole 13A to the first part M2_1, second part M2_2 and third part M2_3 of the second conductive layer M2 are all identical, wherein the distances may also be the vertical distance or the shortest distance. As long as the distances are identical everywhere, the shape of the contact hole 13A does not have any limitation, e.g. formed as a rectangle or a square. Similarly, in order to reduce the stray capacitance between the second conductive layer M2 and the third conductive layer M3, an overcoat layer 14 may further be formed between the passivation layer 13 and the third conductive layer M3 as shown in FIG. 3A. In a word, the difference between this alternative embodiment and the first embodiment is that the second conductive layer M2 is not an enclosed structure in this alternative embodiment but other parts are identical. As the cross-sectional view of this alternative embodiment is identical to FIGS. 2A to 2E, details thereof are not repeated herein.

Figure 4A:
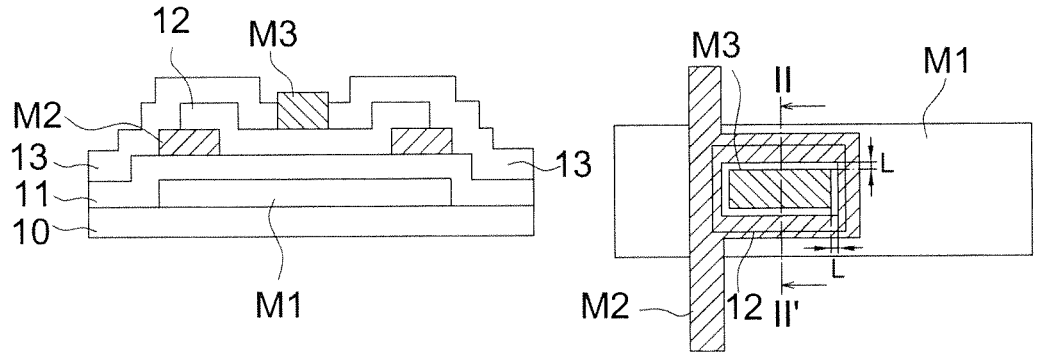
FIGS. 4A-4B show manufacturing processes of the semiconductor device according to a second embodiment of the present disclosure.
Figure 4B:
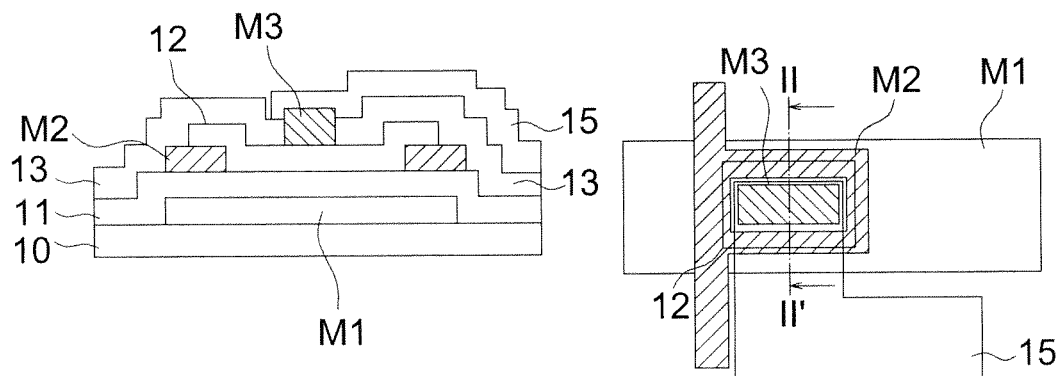

Referring to FIGS. 4A and 4B, they show manufacturing processes of the semiconductor device according to a second embodiment of the present disclosure, wherein methods of forming the first conductive layer M1, the insulating layer 11, the second conductive layer M2, the channel layer 12 and the passivation layer 13 are similar to FIGS. 2A-2D and their corresponding descriptions, and thus details thereof are not repeated herein. Similarly, for simplification, the top view (i.e. the right part) of FIGS. 4A-4B only shows the conductive layers M1-M3, the channel layer 12 and the transparent electrode layer 15 without showing the substrate 10, the insulating layer 11 and the passivation layer 13. The left part is also the cross-sectional view taken along line II-II' of the right part.

Referring to FIG. 4A, in the second embodiment, in order to increase the contact feature between the channel layer 12 and the transparent electrode layer, a third conductive layer M3 is previously formed in the contact hole 13A by means of photolithography. Herein, the third conductive layer M3 is served as the drain/source electrode and is not a transparent electrode. The third conductive layer M3 may be made of Mo, Al, Ti, Cr, Ta, Cu, Nd, W, W—Mo alloy, Indium Tin Oxide (ITO), or the Oxide or Nitrogen thereof, but not limited thereto. As the third conductive layer M3 is only formed in the contact hole 13A, the shape of the third conductive layer M3 is limited by the contact hole 13A. In addition, the third conductive layer M3 is preferably at a center position (i.e. the position of the contact hole 13A) of the inner opening O of the second conductive layer M2. Similarly, in order to increase the channel width/length ratio of the semiconductor device, distances L from edges of the third conductive layer M3 to the second conductive layer M2 are all identical, wherein the distances L may also be the vertical distance or the shortest distance. As long as the distances L are identical everywhere, shapes of the third conductive layer M3 and the inner edge of the second conductive layer M2 do not have any limitation as long as opposite to each other, e.g. formed as opposite rectangles, squares or symmetric polygons. Similarly, in order to improve the contact feature, a contact layer may further be formed between the insulating layer 11 and the second conductive layer M2 and/or between the channel layer 12 and the second conductive layer M2 as shown in FIGS. 2C-1 to 2C-3.

Referring to FIG. 4B, finally a transparent electrode layer 15 electrically coupled to the third conductive layer M3 and extending out from the third conductive layer M3 is formed, and the transparent electrode layer 15 is configured to couple to the pixel electrode. The transparent electrode layer 15 may be made of transparent materials such as ITO, IZO and AZO, but not limited thereto.

Similarly, in the second embodiment, the saturation current of the semiconductor device is effectively improved due to the ring structure of the second conductive layer M2. Since the second conductive layer M2 and the third conductive layer M3 are not formed by the same manufacturing process and not at the same plane, the manufacturing range of the source electrode is increased. In addition, as the channel layer 12 is formed after the second conductive layer M2, the channel layer 12 is not affected by the etching liquid during manufacturing processes if it is a metal oxide semiconductor channel layer. Furthermore, the contact feature between the channel layer 12 and the transparent electrode layer 15 is improved through the third conductive layer M3.

Figure 5A:
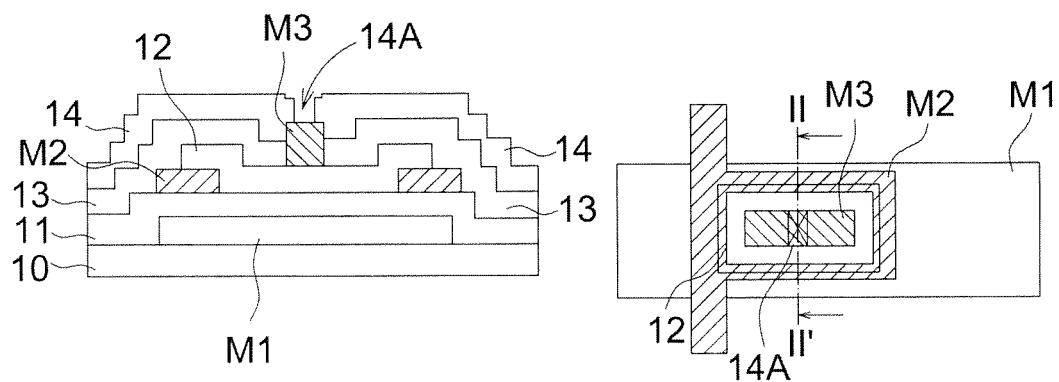
FIGS. 5A-5C show alternative embodiments of the semiconductor device according to the second embodiment of the present disclosure.
Figure 5B:
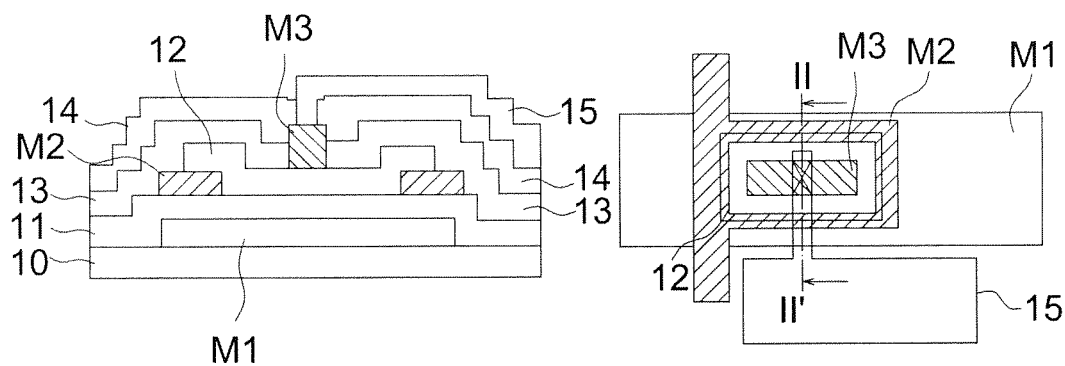

In an alternative embodiment, in order to reduce the stray capacitance between the second conductive layer M2 and the transparent electrode layer 15, an overcoat layer 14 may further be formed between the passivation layer 13 and the transparent electrode layer 15. Referring to FIG. 5A, after the overcoat layer 14 is formed on the third conductive layer M3 and the passivation layer 13, a contact hole 14A is formed corresponding to the contact hole 13A (or the third conductive layer M3) by means of photolithography. Referring to FIG. 5B, finally the transparent electrode layer 15 is formed, by means of photolithography, on the overcoat layer 14 and coupled to the third conductive layer M3 in the contact hole 13A.

Figure 4C:
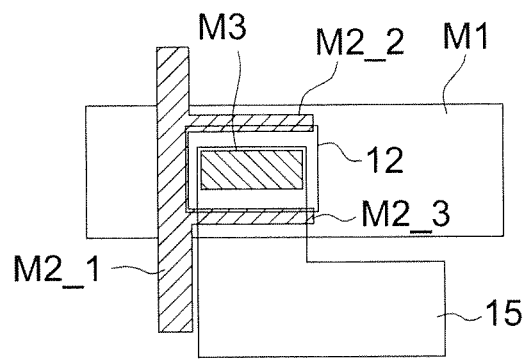
FIG. 4C shows an alternative embodiment of the semiconductor device according to the second embodiment of the present disclosure.
Figure 5C:
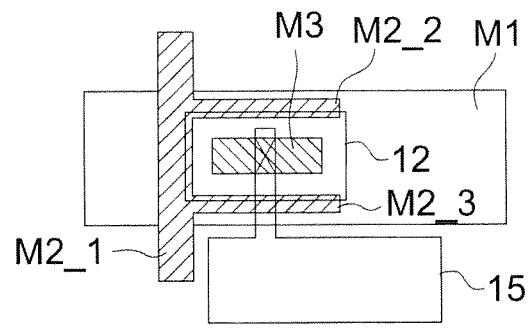

Similarly, in an alternative embodiment, the second conductive layer M2 may be a pi-shaped structure (|=) as shown in FIGS. 4C and 5C instead of an enclosed structure.

In this alternative embodiment, the second conductive layer M2 is also formed on the insulating layer 11 and has a first part M2_1, a second part M2_2 and a third part M2_3, wherein the first part M2_1 may be served as a part of the data line, and the second part M2-2 and the third part M2_3 perpendicularly extend from the first part M2_1 in parallel so as to form a non-enclosed structure. The channel layer 12 is formed inside the first part M2_1, second part M2_2 and third part M2_3 and covers a part of the first part M2_1, second part M2_2 and third part M2_3 respectively. The passivation layer 13 is formed upon the channel layer 12 to cover the channel layer 12. In other embodiments, the passivation layer 13 may also cover a part of the second conductive layer M2 that is not covered by the channel layer 12, and has a contact hole 13A located between the second part M2_2 and the third part M2_3. The third conductive layer M3 is formed inside the contact hole 13A. This alternative embodiment differs from FIGS. 4B and 5B only in that the second conductive layer M2 is not an enclosed structure, and details similar to FIGS. 4B and 5B are not repeated herein.

As mentioned above, in the conventional thin film transistor the source electrode and the drain electrode are formed by the same manufacturing process and at the same plane so that how to increase the channel width-length ratio becomes an important issue. Therefore, the present disclosure further provides a semiconductor device (FIGS. 2E, 3A, 3B, 4B, 4C, 5B and 5C) in which the source electrode and the drain electrode are not coplanar structure and may be formed as an enclosed structure or a pi-shaped structure so as to increase the channel width/length ratio.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A semiconductor device, comprising:
   a first conductive layer;
   an insulating layer covering the first conductive layer;
   a second conductive layer formed on the insulating layer and having an inner opening;
   a channel layer formed on the inner opening of the second conductive layer to fully cover the inner opening;
   a passivation layer formed upon the channel layer to cover the channel layer and having a contact hole inside the inner opening of the second conductive layer; and
   a third conductive layer formed in and extending out from the contact hole.

2. The semiconductor device as claimed in claim 1, wherein distances from edges of the contact hole to the second conductive layer are all identical, or the contact hole locates at a center position of the inner opening of the second conductive layer.

3. The semiconductor device as claimed in claim 1, wherein the contact hole and an inner edge of the second conductive layer are formed as a rectangle, a square or a symmetric polygon.

4. The semiconductor device as claimed in claim 1, wherein the third conductive layer is a transparent electrode layer.

5. The semiconductor device as claimed in claim 1, further comprising an overcoat layer between the passivation layer and the third conductive layer.

6. The semiconductor device as claimed in claim 1, wherein the channel layer is a metal oxide, an amorphous silicon, a polysilicon or a single crystal silicon semiconductor channel layer.

7. The semiconductor device as claimed in claim 1, further comprising a contact layer formed between the second conductive layer and at least one of the insulating layer and the channel layer.

8. A semiconductor device, comprising:
   a first conductive layer;
   an insulating layer covering the first conductive layer;
   a second conductive layer formed on the insulating layer and having an inner opening;
   a channel layer formed on the inner opening of the second conductive layer to fully cover the inner opening;

a passivation layer formed upon the channel layer to cover the channel layer and having a contact hole inside the inner opening of the second conductive layer; and a third conductive layer formed in the contact hole; and a transparent electrode layer electrically coupled to and extending out from the third conductive layer.

9. The semiconductor device as claimed in claim 8, wherein distances from edges of the third conductive layer to the second conductive layer are all identical, or the third conductive layer locates at a center position of the inner opening of the second conductive layer.

10. The semiconductor device as claimed in claim 8, wherein the third conductive layer and an inner edge of the second conductive layer are formed as a rectangle, a square or a symmetric polygon.

11. The semiconductor device as claimed in claim 8, further comprising an overcoat layer between the passivation layer and the transparent electrode layer.

12. The semiconductor device as claimed in claim 8, wherein the channel layer is a metal oxide, an amorphous silicon, a polysilicon or a single crystal silicon semiconductor channel layer.

13. The semiconductor device as claimed in claim 8, further comprising a contact layer formed between the second conductive layer and at least one of the insulating layer and the channel layer.

14. A semiconductor device, comprising:

a first conductive layer;

an insulating layer covering the first conductive layer;

a second conductive layer formed on the insulating layer and comprising a first part, a second part and a third part, wherein the second part and the third part extend perpendicularly from the first part;

a channel layer formed inside the first part, the second part and the third part and covering a part of the first part, the second part and the third part;

a passivation layer formed upon the channel layer to cover the channel layer and having a contact hole between the second part and the third part; and a third conductive layer formed in the contact hole.

15. The semiconductor device as claimed in claim 14, wherein the third conductive layer is a transparent electrode layer and extends out from the contact hole, or the semiconductor device further comprises a transparent electrode layer electrically coupled to and extending out from the third conductive layer.

16. The semiconductor device as claimed in claim 15, further comprising an overcoat layer between the passivation layer and the transparent electrode layer.

17. The semiconductor device as claimed in claim 14, wherein distances from edges of the contact hole to the first part, the second part and the third part of the second conductive layer are all identical.

18. The semiconductor device as claimed in claim 14, wherein the contact hole is formed as a rectangle or a square.

19. The semiconductor device as claimed in claim 14, wherein the channel layer is a metal oxide, an amorphous silicon, a polysilicon or a single crystal silicon semiconductor channel layer.

20. The semiconductor device as claimed in claim 14, further comprising a contact layer formed between the second conductive layer and at least one of the insulating layer and the channel layer.

* * * * *